(12) United States Patent
Kwon

(10) Patent No.: US 6,373,770 B1
(45) Date of Patent: Apr. 16, 2002

(54) INTEGRATED CIRCUIT MEMORY DEVICES WITH CONFIGURABLE BLOCK DECODER CIRCUITS

(75) Inventor: Suk-Chun Kwon, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/322,271

(22) Filed: May 28, 1999

(30) Foreign Application Priority Data

May 29, 1998 (KR) ............................................ 98-19868

(51) Int. Cl.$^7$ ................................................ G11C 7/00
(52) U.S. Cl. ..................... 365/225.7; 365/200; 365/231; 711/152; 326/38; 714/3; 714/8; 714/42; 714/723
(58) Field of Search .............................. 365/225.7, 200, 365/231; 326/38; 711/152; 712/219; 714/3, 8, 42, 54, 723

(56) References Cited

U.S. PATENT DOCUMENTS

| | | | | |
|---|---|---|---|---|
| 4,847,810 A | * | 7/1989 | Tagami ........................ 365/200 |
| 5,542,084 A | * | 7/1996 | Lowe, Jr. ..................... 345/501 |
| 5,635,854 A | * | 6/1997 | Shimanek et al. ............. 326/38 |
| 5,768,198 A | * | 6/1998 | Moroo ........................ 365/200 |
| 5,911,058 A | * | 6/1999 | Ogawa ........................ 712/219 |

\* cited by examiner

*Primary Examiner*—B. James Peikari
(74) *Attorney, Agent, or Firm*—Myers Bigel Sibley & Sajovec

(57) ABSTRACT

A memory device includes a memory array and a configurable decoder circuit operatively associated with the memory array and configurable to one of a first state or a second state. In the first state, the configurable decoder circuit is operative, responsive to receipt of an address associated with a portion, e.g., a block, of the memory array, to select the portion while producing a first status signal. In the second state, the configurable decoder circuit is operative, responsive to receipt of an address associated with the portion of the memory array, to prevent selection of the portion while producing a second status signal. The first status signal may indicate, for example, that the portion is valid, while the second status signal may indicate that the portion is invalid. The configurable decoder circuit may include a plurality of configurable block decoder circuits, a respective one of which is coupled to a respective one of a plurality of memory blocks and configurable to one of a first state or a second state. In the first state, the configurable block decoder circuit is operative, responsive to receipt of an address associated with the corresponding memory block, to select the corresponding memory block while producing a first status signal. In the second state, the configurable block decoder circuit is operative, responsive to receipt of an address associated with the corresponding memory block, to prevent selection of the corresponding memory block while producing a second status signal. Related memory device operating methods are also discussed.

12 Claims, 4 Drawing Sheets

INTEGRATED CIRCUIT MEMORY DEVICES WITH CONFIGURABLE BLOCK DECODER CIRCUITS

FIELD OF THE INVENTION

The present invention relates to integrated circuit devices and methods of operation thereof, and more particularly, to integrated circuit memory devices and methods of operation thereof.

BACKGROUND OF THE INVENTION

Integrated circuit memory devices, such as nonvolatile memory devices (commonly referred to as "flash" memories), typically include a memory cell array divided into plural memory cell blocks, each of the memory cell blocks representing an erase unit. Each memory cell block typically has multiple pages (word lines) to which multiple memory cells are connected.

Generally, rewrite times of such devices are limited by such factors as program erase cycle time. Weak memory cells in the array may be detected by testing the device under predetermined conditions, in what is commonly referred to as a cycling test. In such a test, write and erase operations typically are repeatedly performed under unfavorable conditions. Blocks having one or more cells with excessive leakage current are preferably avoided during a cycling test, because of the high voltage typically used for erasing and writing.

As is well known in the art, a column or row redundancy scheme may be used to repair a memory device with one or more defective memory cells, but the number of cells that need repair can exceed the available number of redundant cells. Even if a device includes an invalid block, however, it can still be used in some applications. The device manufacturer can provide a user with information indicating the invalid block (or information indicating valid blocks) stored in the device itself. Using this information, the user can avoid an invalid block of the device by means of an address mapping (e.g., an invalid block table).

A flow diagram for describing a method of identifying an invalid block in the device according to the prior art is illustrated in FIG. 1. A block addresses BLK applied to the device is initialized to '0' (step S10), and a corresponding block is selected and read (step S11). The data read is checked to determine whether the selected block is valid or invalid (step S12). If the selected block is invalid, an invalid block table is updated (step S13). The invalid block table may be maintained by a computer or other data processing system (e.g., a microcontroller), and stored in a storage device (e.g., a buffer in the microcontroller). If the selected block is valid and the address is not equal to the last address of the device, the address is incremented and a new block is selected and tested (steps S14, S15, S11, S12). This incremental testing continues until all of the memory blocks are checked.

As described above, it is desirable to avoid blocks having cells with high leakage currents when a cycling test is performed. However, if knowledge of these cells is not available or incomplete, a device with such a defect may be classified as a fail device without regard to the number of the invalid memory cell blocks, which can lead to reduced yield in manufacturing.

SUMMARY OF THE INVENTION

In light of the foregoing, it is an object of the present invention to provide memory devices and methods of operation thereof in which a status of a memory block can be determined without accessing the memory block.

It is another object of the present invention to provide memory devices and methods of operation thereof in which invalid cells can be identified and avoided during memory cycling tests.

These and other objects, feature and advantages are provided according to the present invention by memory devices and methods of operation thereof in which a decoder circuit is configurable to generate a status signal in response to receipt of an address for a portion, e.g., a block, of a memory array, in lieu of selecting the portion. In this manner, a block containing an invalid cell, e.g., a cell with undesirably high leakage current, can be identified as such during a test such as a cycling test, without actually accessing the block.

According to exemplary embodiments, a configurable decoder circuit includes a plurality of fuse-programmable block decoder circuits, a respective one of which is coupled to a memory block. A block decoder circuit may be configured to a first state in which it is operative, responsive to receipt of an address associated with the corresponding memory block, to select the memory block while generating a first status signal, e.g., a status signal indicating that the block is valid. Alternatively, the block decoder circuit may be configured to a second state in which it is operative, responsive to receipt of the address signal associated with the corresponding memory block, to prevent selection of the memory block while generating a second status signal, e.g., a signal indicating that the block is invalid. The first and second status signals may be provided by taking a signal produced by a status signal generating circuit to a first state or a second state.

According to embodiments of the present invention, a memory device includes a memory array and a configurable decoder circuit operatively associated with the memory array and configurable to one of a first state or a second state. In the first state, the configurable decoder circuit is operative, responsive to receipt of an address associated with a portion of the memory array, to select the portion while producing a first status signal. In the second state, the configurable decoder circuit is operative, responsive to receipt of an address associated with the portion of the memory array, to prevent selection of the portion while producing a second status signal. The first status signal may indicate, for example, that the portion is valid, while the second status signal may indicate that the portion is invalid.

In other embodiments of the present invention, the memory array includes a plurality of memory blocks. The configurable decoder circuit includes a plurality of configurable block decoder circuits, a respective one of which is coupled to a respective one of the plurality of memory blocks and configurable to one of a first state or a second state. In the first state, a configurable block decoder circuit is operative, responsive to receipt of an address associated with the corresponding memory block, to select the corresponding memory block while producing a first status signal. In the second state, a configurable block decoder circuit is operative, responsive to receipt of an address associated with the corresponding memory block, to prevent selection of the corresponding memory block while producing a second status signal.

In yet another embodiment of the present invention, a configurable block decoder circuit includes an address decoder circuit that receives addresses and that generates an address decoder output signal. The address decoder output signal takes on a first state in response to a particular address and takes on a second state in response to an address other than the particular address. A programmable status signal generating circuit is responsive to the address decoder circuit and includes a programmable element, such as a fuse. The programmable status signal generating circuit is operative to produce a status signal in response to the address decoder output signal, the status signal having one of a first state or a second state depending on a state of the programmable element.

The configurable block decoder circuit may further include a memory block control signal generating circuit responsive to the address decoder circuit and to the status signal generating circuit and operative to produce a memory block control signal therefrom. The memory block control signal takes on a first state when the decoder output signal is in the first state and the status signal is in the first state, and takes on a second state when the address decoder output signal is in the first state and the status signal is in the second state. The corresponding memory block is responsive to the memory block control signal.

The memory device may further include a status output circuit responsive to the address decoder output signal and to the status signal. The status output circuit produces a status output signal that takes on a first state when the address decoder output signal is in the first state and the status signal is in the first state and takes on a second state when the address decoder output signal is in the first state and the status signal is in the second state.

Related memory device operating methods are also discussed.

DETAILED DESCRIPTION OF EMBODIMENTSl

Figure 1:
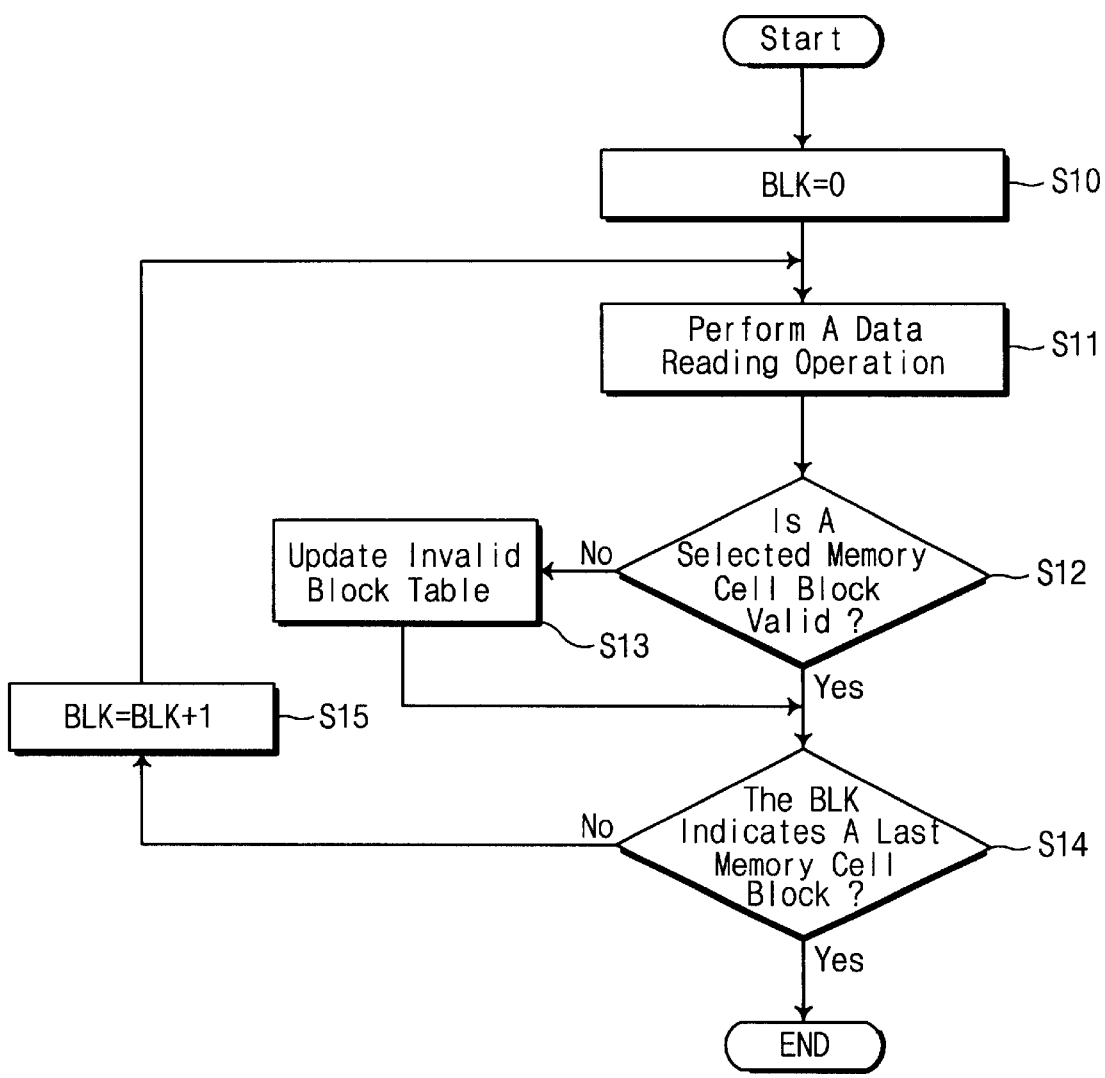
FIG. 1 is a flowchart illustrating testing operations for a memory device according to the prior art.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 2:
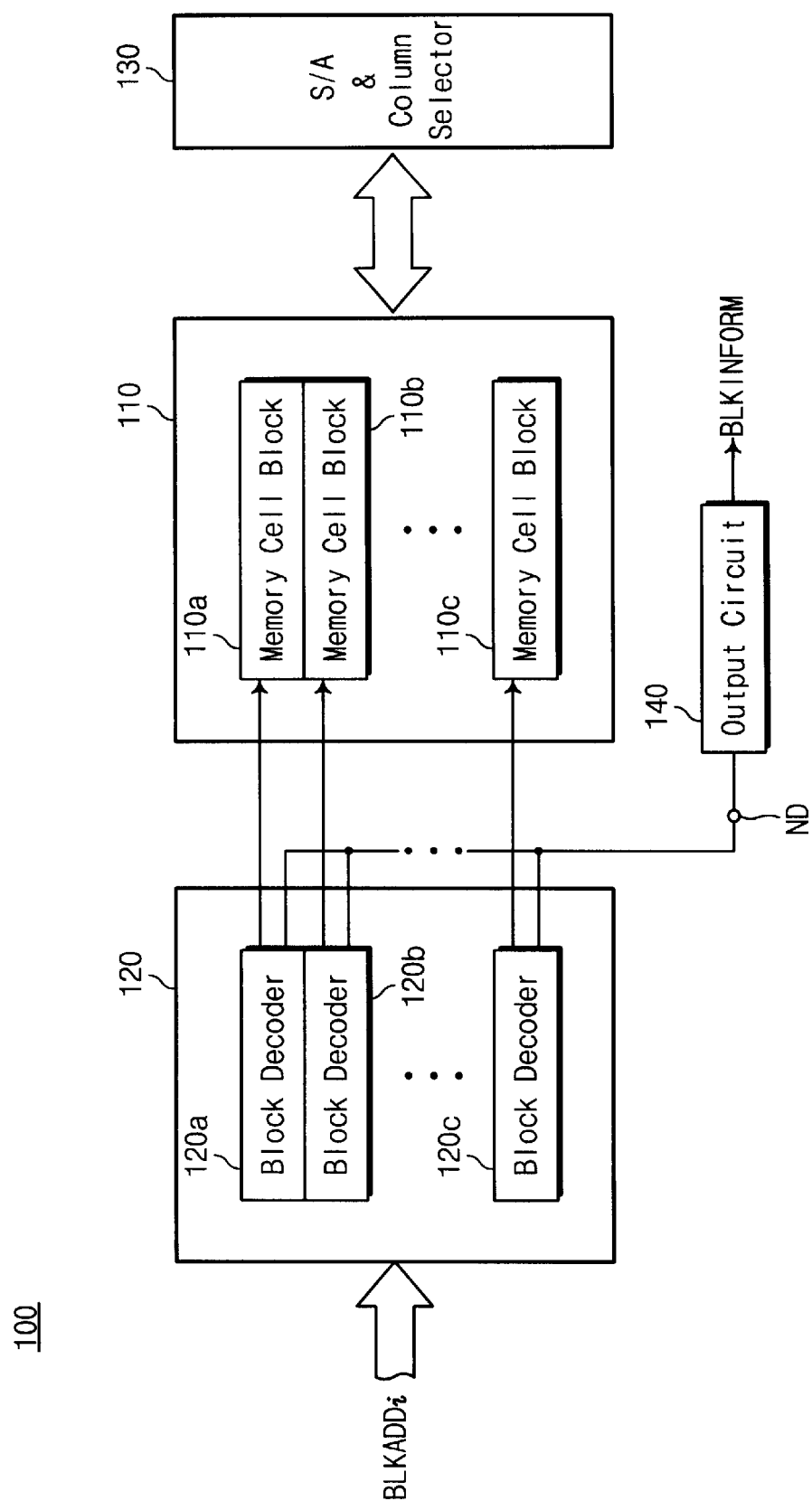
FIG. 2 is a block diagram of a memory device according to an embodiment of the present invention.

FIG. 2 illustrates a nonvolatile memory device 100 according to an embodiment of the present invention. A memory cell array 110 includes a plurality of memory cell blocks 110a, 110b, . . . , 110c, a respective one of which constitutes an erase unit. Each memory cell block 110a, 110b, . . . , 110c includes a plurality of memory cells (not shown) that store data and are arranged in rows and columns. A plurality of word lines (not shown) extends along the direction of the rows, while a plurality of bit lines (not shown) extend along the direction of the columns.

The device 100 further includes a configurable decoder circuit 120 that selects one of the memory cell blocks 110a, 110b, . . . , 110c in accordance with an address supplied on block address lines BLKADDi. The configurable decoder circuit 120 includes a plurality of configurable block decoder circuits 120a, 120b, . . . , 120c, a respective one of which is coupled to a respective one of the memory cell blocks 110a, 110b, . . . , 110c. The configurable block decoder circuits 120a, 120b, . . . , 120c are also commonly connected to an input node ND of a status output circuit 140. Each of the block decoder circuits 120a, 120b, . . . , 120c is connected to the block address lines BLKADDi. A respective one of the configurable block decoder circuits 120a, 120b, . . . , 120c is selected for a respective address applied to the block address lines BLKADDi, with the selected configurable block decoder circuit generating a control signal that selects the memory cell block associated with the address applied to the block address lines BLKADDi.

In addition, the selected configurable block decoder circuit produces a status signal at the input node ND of the output circuit 140, the status signal indicating whether the selected memory cell block is valid or invalid. The output circuit 140 responsively produces a status output signal BLKINFORM at the exterior of the device 100. Operations of the configurable block decoder circuit 120a and the status output circuit 140 will be described below, but the description thereof is equally applicable to the other configurable block decoder circuits 120b, . . . , 120c.

Figure 3:
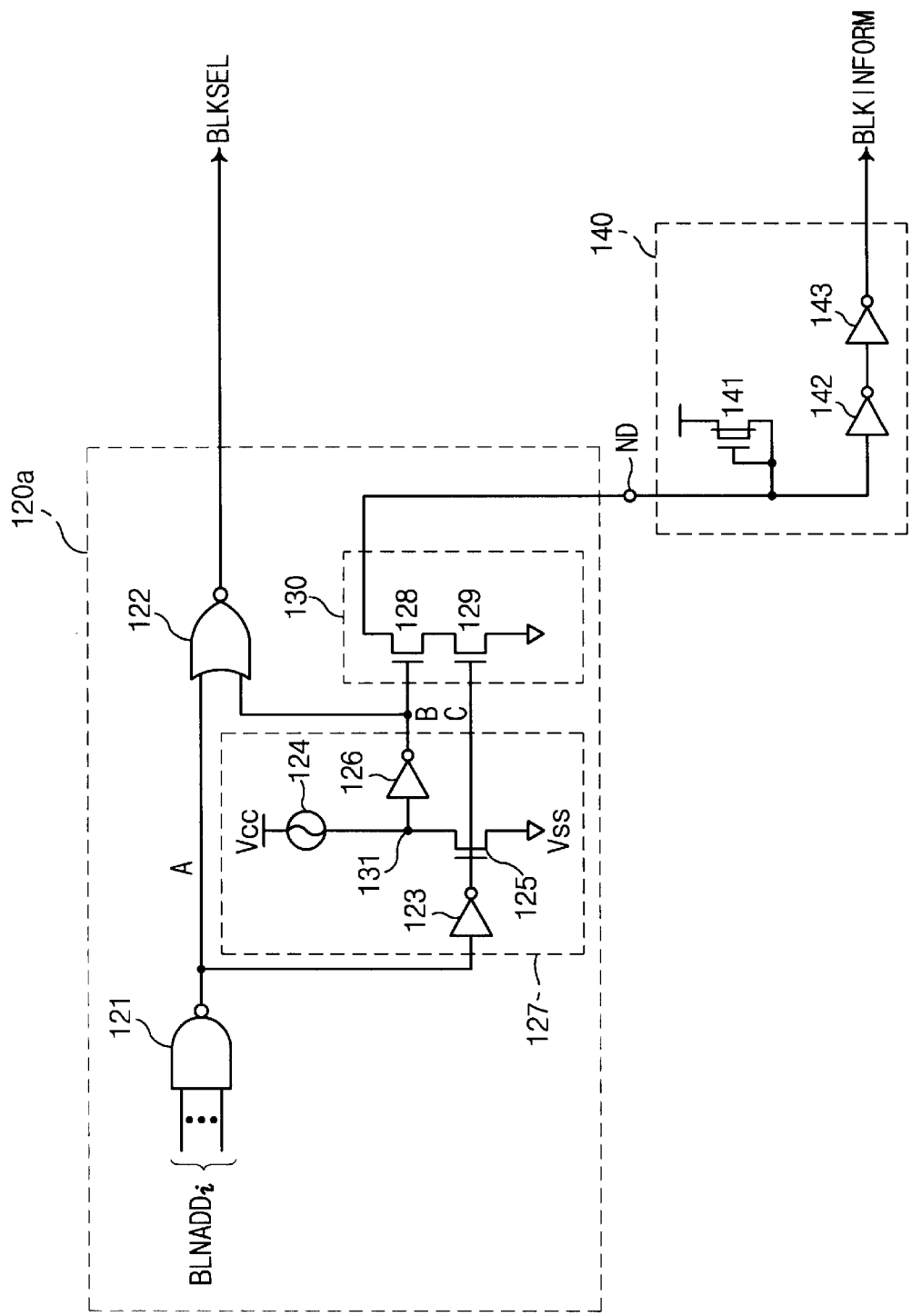
FIG. 3 is a schematic diagram of a configurable block decoder circuit according to an embodiment of the present invention.

A circuit diagram of an exemplary configurable block decoder circuit 120a and an exemplary status output circuit 140 is provided in FIG. 3. Referring to FIG. 3, the configurable block decoder circuit 120a includes an address decoder circuit (NAND gate) 121, a memory block control signal generating circuit (NOR gate) 122, a fuse-programmable status signal generating circuit 127, and a discharge circuit 130 that links the programmable status signal generating circuit 127 to the status output circuit 140. The NAND gate 121 decodes an address applied to the address lines BLKADDi, responsively generating an address decoder output signal A.

The programmable status signal generating circuit 127 may be used to store valid/invalid block information about the memory block associated with the configurable block decoder circuit 120a. The programmable status signal generating circuit includes two inverters 123, 126, a fuse 124, and an NMOS transistor 125. The fuse 124 has a first end connected to a power supply bus Vcc and a second end connected to a drain of the NMOS transistor 125. The NMOS transistor 125 has a source electrode coupled to a signal ground Vss and a gate electrode that receives an inverted version of the address decoder output signal A from the inverter 123.

The fuse 124 may include, for example, a laser fuse, transistor, or other element that may be programmed into one of a conducting and a non-conducting state. The inverter 126 is connected to both the drain of the NMOS transistor 125 and the second end of the fuse 124 at a node 131. The inverter 126 inverts the signal at the node 131, producing a status signal B.

The NOR gate 122 produces a memory block control signal BLKSEL in response to the address decoder output signal A and the status signal B. The discharge circuit 130 controls the voltage at the input node ND of the output circuit 140 responsive to the status signal B and the inverted address decoder output signal C produced by the inverter 123. The discharge circuit 130 includes two NMOS transistors 128, 129 that have current paths connected in series between the input terminal ND and the signal ground Vss, and gate electrodes that receive the status signal B and the inverted address decoder output signal C, respectively. The output circuit 140 supplies the input node ND with a voltage approaching that of the power supply bus Vcc via a depletion-mode transistor 141, and outputs a status output signal BLKINFORM through series-connected inverters 142, 143 responsive to the signal applied to the input node ND.

Operations of the configurable block decoder circuit 120a and the status output circuit 140 according to the preferred embodiment of the present invention will now be discussed with reference to FIG. 3. When an address corresponding to the memory block associated with the configurable block decoder circuit 120a is applied to the block address lines BLKADDi, and thus to the NAND gate 121, the NAND gate 121 generates a logic "low" state in the address decoder output signal A; otherwise, the address decoder output signal A remains at a logic "high." When the address decoder output signal A is "low," the NMOS transistors 125, 129 are turned on through the inverter 123, and the input node ND of the status output circuit 140 is charged up to the voltage of the power supply bus Vcc through the depletion-mode transistor 141.

If the fuse 124 is intact, indicating that the corresponding memory cell block is valid, the signal at the node 131 goes to a logic "high" via the action of the intact fuse 124. Consequently, the status signal B goes to a logic "low," and the NOR gate 122 drives the memory block control signal BLKSEL to a logic "high," selecting the corresponding memory block. Because the status signal B is "low," the NMOS transistor 128 is turned off, so that the input node 1 ND of the status output circuit 140 and the status output signal BLKINFORM are logic "high."

If the fuse 124 is opened, however, the node 131 goes to a logic "low" via the action of the turned-on NMOS transistor 125. The status signal B from the inverter 126 goes to a logic "high," and the NOR gate 122 takes the memory block control signal BLKSEL to a logic "low," preventing selection of the corresponding memory block even though the address applied to the block address lines BLKADDi corresponds to the memory block.

Because the status signal B is at a logic "high," the NMOS transistor 128 of the discharge circuit 130 turns on, causing the input node ND of the status output circuit 140 to be discharged to near the signal ground Vss through the NMOS transistors 128, 129. Consequently, the status output signal BLKINFORM from the status output circuit 140 is taken to a logic "low," indicating that the corresponding memory cell block is invalid.

Figure 4:
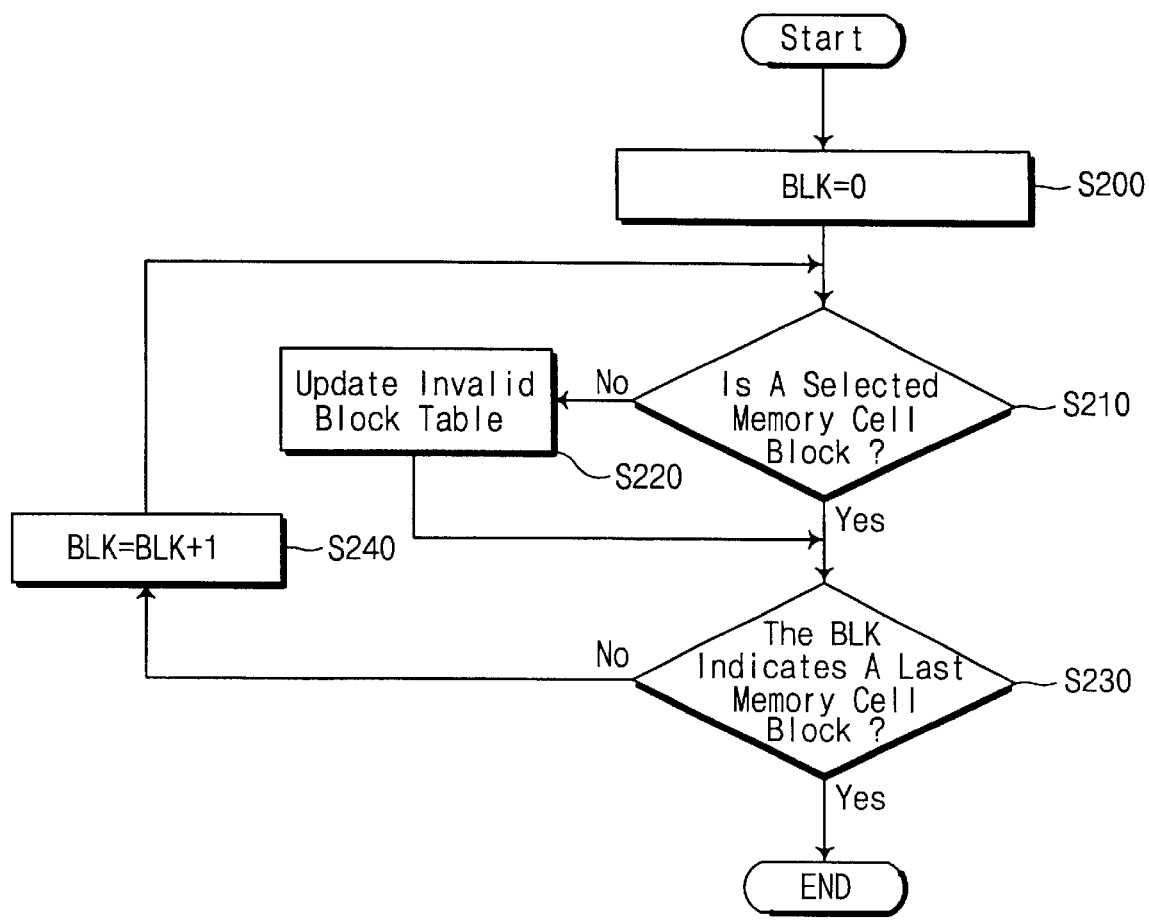
FIG. 4 is a flowchart illustrating exemplary operations for testing a memory device according to an aspect of the present invention.

As set forth above, each configurable block decoder circuit 120a, 120b, . . . , 120c provides valid/invalid block information and either allows or prevents a corresponding memory cell block to be selected in keeping with the valid/invalid block information. Thus, for example, when the corresponding memory cell block is invalid (e.g., when the memory cell block has a memory cell with high leakage current), the fuse in the corresponding configurable block decoder circuit can be blown, preventing access to the memory cell block. Accordingly, a cycling test can be performed while avoiding selection of the block FIG. 4 is a flowchart illustrating exemplary operations for identifying invalid blocks in a memory device according to an aspect of the present invention. A block address BLK (e.g., an address applied to the address lines BLKADDi of FIG. 3) is initialized to '0' (step S200). The validity or invalidity of the corresponding address may then be checked, without requiring actual selection (e.g., reading or other access) of the block, using the circuit of FIG. 3 (step S210). If the status output signal produced indicates that the block is invalid, the address of the invalid block may be added to an invalid block table (step S220). Otherwise, if the block address is not the last block address, the block address is incremented and the next block is checked (steps S230, S240, S210).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A memory device, comprising:

a memory array including a plurality of memory blocks; and a plurality of configurable block decoder circuits, respective ones of which are operatively associated with respective memory blocks of said plurality of memory blocks, wherein said configurable block decoder circuits are individually configurable to one of a first state or a second state, wherein each of said configurable block decoder circuits in the first state is operative, responsive to receipt of a block address associated with the associated memory block, to select the associated memory block while producing a first status signal, and wherein each of said configurable block decoder circuits in the second state is operative, responsive to receipt of the block address associated with the associated memory block, to prevent selection of the associated memory block without selection of an alternative memory block while producing a second status signal.

2. A memory device according to claim 1, wherein the first status signal indicates that the corresponding memory block is valid, and wherein the second status signal indicates that the corresponding memory block is invalid.

3. A memory device according to claim 1, wherein at least one of said configurable block decoder circuits is fuse-programmable.

4. A memory device according to claim 1, wherein at least one of the configurable block decoder circuits comprises:

a block address decoder circuit that receives block addresses and that generates an address decoder output signal, said block address decoder output signal taking on a first state in response to a select block address and taking on a second state in response to a block address other than said select block address; and a programmable status signal generating circuit responsive to said block address decoder circuit and including a programmable element, wherein said programmable status signal generating circuit is operative to produce a status signal in response to the block address decoder output signal, said status signal having one of a first state or a second state depending on a state of said programmable element.

5. A memory device according to claim 4, wherein said programmable element comprises a fuse.

6. A memory device according to claim 4:

wherein said at least one of the configurable block decoder circuits further comprises a memory block control signal generating circuit responsive to said block address decoder circuit and to said status signal generating circuit and operative to produce a memory block control signal therefrom, said memory block control signal taking on a first state when said block address decoder output signal is in said first state and said status signal is in said first state and taking on a second state when said block address decoder output signal is in said first state and said status signal is in said second state; and wherein said corresponding memory block is responsive to said memory block control signal.

7. A memory device according to claim 4, further comprising a status output circuit responsive to said block address decoder output signal and to said status signal, said status output circuit producing a status output signal taking on a first state when said block address decoder output signal is in said first state and said status signal is in said first state and taking on a second state when said block address decoder output signal is in said first state and said status signal is in said second state.

8. A memory device according to claim 4:

wherein the block address decoder circuit comprises a multi-input NAND gate circuit that generates the block address decoder output signal; and wherein the programmable status signal generating circuit comprises:
 a first inverter that receives the block address decoder output signal and generates an inverted block decoder output signal therefrom;
 an NMOS transistor having a gate electrode that receives the inverted block decoder output signal and a source electrode coupled to a signal ground node;
 a fuse connected between a drain electrode of the NMOS transistor and a power supply node; and
 a second inverter having an input coupled to the drain electrode of the NMOS transistor and that produces the status signal from a signal at the drain electrode of the NMOS transistor.

9. A memory device according to claim 8, further comprising:

a discharge circuit comprising series connected second and third NMOS transistors, wherein the second NMOS transistors has gate electrode that receives the status signal and a source electrode coupled to a drain electrode of the third NMOS transistor, and wherein the third NMOS transistor has a gate electrode that receives the inverted block address decoder output signal and a source electrode coupled to the signal ground; and a status output circuit comprising a buffer circuit with a depletion-mode transistor coupled to an input thereof, the depletion-mode transistor having a drain electrode coupled to the power supply node and gate and source electrodes coupled to a drain electrode of the second NMOS transistor.

10. An integrated circuit memory device, comprising:

a memory array including a plurality of memory blocks; and a configurable block decoder circuit configurable to generate a status signal in response to receipt of an address for one of said plurality of memory blocks of said memory array in lieu of selecting any of said plurality of memory blocks, wherein said configurable block decoder circuit is configurable to one of:
 a first state in which said configurable block decoder circuit is operative, responsive to receipt of the address associated with the one memory block of the plurality of memory blocks, to select said one memory block while generating a first status signal; and
 a second state in which said configurable block decoder circuit is operative, responsive to receipt of the address signal associated with said one memory block, to prevent selection of said one memory block while generating a second status signal.

11. A memory device according to claim 10, wherein said configurable block decoder circuit is fuse-programmable.

12. A memory device according to claim 10, wherein the second status signal indicates that said one of said plurality of memory blocks of said memory array is invalid.

* * * * *